United States Patent
Kwon et al.

(10) Patent No.: US 10,529,956 B2
(45) Date of Patent: Jan. 7, 2020

(54) METHOD OF MANUFACTURING DISPLAY DEVICE

(71) Applicant: Samsung Display Co., Ltd., Yongin-si, Gyeonggi-Do (KR)

(72) Inventors: Younggil Kwon, Yongin-si (KR); Jiyoung Choung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/031,246

(22) Filed: Jul. 10, 2018

(65) Prior Publication Data
US 2019/0189972 A1    Jun. 20, 2019

(30) Foreign Application Priority Data
Dec. 18, 2017    (KR) .................. 10-2017-0174166

(51) Int. Cl.
*H01L 51/56* (2006.01)
*H01L 27/32* (2006.01)

(52) U.S. Cl.
CPC .......... *H01L 51/56* (2013.01); *H01L 27/3246* (2013.01); *H01L 2227/323* (2013.01)

(58) Field of Classification Search
CPC .............. H01L 51/56; H01L 27/3246; H01L 2227/323
See application file for complete search history.

(56) References Cited

U.S. PATENT DOCUMENTS

| | | | |
|---|---|---|---|
| 2001/0017516 A1* | 8/2001 | Gonther | H01L 27/3283 313/504 |
| 2013/0236999 A1 | 9/2013 | Lee et al. | |
| 2014/0127625 A1 | 5/2014 | Defranco et al. | |
| 2016/0097977 A1 | 4/2016 | Ober et al. | |
| 2017/0025610 A1 | 1/2017 | Kwon | |
| 2017/0250344 A1 | 8/2017 | Choi et al. | |

FOREIGN PATENT DOCUMENTS

| | | |
|---|---|---|
| KR | 10-2002-0006306 A | 1/2002 |
| KR | 10-2011-0009708 A | 1/2011 |
| KR | 10-2017-0102145 A | 9/2017 |

* cited by examiner

*Primary Examiner* — Karen Kusumakar
(74) *Attorney, Agent, or Firm* — Lewis Roca Rothgerber Christie LLP

(57) ABSTRACT

A method of manufacturing a display device includes forming a pixel-defining layer including an opening corresponding to a pixel electrode and a bank defining the opening, forming a first non-photosensitive layer on the pixel-defining layer, forming a temporary layer including a second non-photosensitive material different from a material of the first non-photosensitive layer on a portion of the first non-photosensitive layer, forming an inorganic material layer on the first non-photosensitive layer using the temporary layer such that the inorganic material layer includes a first open region corresponding to the opening, forming a second open region overlapping the first open region in the first non-photosensitive layer, wherein a width of the second open region is greater than a width of the first open region, and forming an intermediate layer on the pixel electrode by using the first non-photosensitive layer and the inorganic material layer as a template.

20 Claims, 17 Drawing Sheets

METHOD OF MANUFACTURING DISPLAY DEVICE

CROSS-REFERENCE TO RELATED APPLICATION

Korean Patent Application No. 10-2017-0174166, filed on Dec. 18, 2017, in the Korean Intellectual Property Office, and entitled: "Method of Manufacturing Display Device," is incorporated by reference herein in its entirety.

BACKGROUND

1. Field

One or more embodiments relate to a method of manufacturing a display device.

2. Description of the Related Art

An organic light-emitting display device is a display device in which each pixel includes an organic light-emitting diode (OLED). The OLED includes a pixel electrode, an opposite electrode facing the pixel electrode, and an emission layer between the pixel electrode and the opposite electrode.

SUMMARY

Embodiments are directed to a method of manufacturing a display device including forming a pixel electrode, forming a pixel-defining layer including an opening corresponding to the pixel electrode and a bank portion defining the opening, forming a first non-photosensitive layer on the pixel-defining layer, forming a temporary layer on a portion of the first non-photosensitive layer, the temporary layer including a second non-photosensitive material different from a material of the first non-photosensitive layer, forming an inorganic material layer on the first non-photosensitive layer by using the temporary layer to block a formation of the inorganic material layer on the portion of the first non-photosensitive layer on which the temporary layer is formed, such that the inorganic material layer includes a first open region corresponding to the opening in the pixel defining layer, forming a second open region in the first non-photosensitive layer, the second open region overlapping the first open region, and a width of the second open region being greater than a width of the first open region, and forming an intermediate layer on the pixel electrode by using the first non-photosensitive layer and the inorganic material layer as a template.

The method may further include forming a conductive layer on the intermediate layer.

In forming the conductive layer, the first non-photoconductive layer and the inorganic material layer, respectively including the second open region and the first open region, may be used as a template.

The temporary layer including the second non-photosensitive material may have an undercut structure in which a width of a lower portion thereof is less than a width of an upper portion thereof.

The lower portion of the temporary layer may include the second non-photosensitive material, and the upper portion of the temporary layer may include a material different from the material of the lower portion of the temporary layer.

The upper portion of the temporary layer may include a photosensitive material.

In forming the inorganic material layer, an end of the inorganic material layer adjacent to the first open region is spaced apart from a lower portion of the temporary layer by a preset interval. Forming the second open region in the first non-photosensitive layer may include removing the temporary layer and a portion of the first non-photosensitive layer overlapping the temporary layer.

A width of the second open region of the first non-photosensitive layer may be greater than a width of the pixel electrode exposed through the opening of the pixel-defining layer.

In forming the intermediate layer, a material forming the intermediate layer may be incident obliquely with respect to a direction perpendicular to an upper surface of the pixel electrode such that the intermediate layer is formed on the pixel electrode and the bank portion adjacent to the pixel electrode.

The first non-photosensitive layer may include a fluorine-based non-photosensitive material.

Embodiments are also directed to a method of manufacturing a display device including forming a pixel electrode, forming an insulating layer including an opening corresponding to the pixel electrode and a bank portion defining the opening, forming a first non-photosensitive layer on the insulating layer, forming a temporary layer on a portion of the first non-photosensitive layer, the temporary layer including a material different from a material of the first non-photosensitive layer and having an undercut structure, forming a shadow layer on the first non-photosensitive layer by using the temporary layer as a template, the shadow layer including a first open region corresponding to the opening, forming a second open region in the first non-photosensitive layer, the second open region overlapping the first open region of the shadow layer and having a width greater than a width of the first open region, forming a material layer on the pixel electrode by using the first non-photosensitive layer and the shadow layer respectively as a template including the second open region and the first open region, and removing the first non-photosensitive layer and the shadow layer.

The temporary layer may include a second non-photosensitive material.

The shadow layer may include at least one of metal and an inorganic insulating material.

In forming the shadow layer, an end of the shadow layer adjacent to the first open region may be spaced apart from a lower portion of the temporary layer by a preset interval.

Forming the second open region in the first non-photosensitive layer includes removing the temporary layer.

The material layer may be a conductive layer or an intermediate layer including an emission layer.

The material layer may be formed by thermal evaporation.

The first non-photosensitive layer may include a fluorine-based non-photosensitive material.

In forming the second open region in the first non-photosensitive layer, an end of the shadow layer adjacent to the first open region may extends farther toward a center of the first open region than an end of the first non-photosensitive layer adjacent to the second open region.

In forming the material layer, a material forming the material layer may be incident obliquely with respect to a direction perpendicular to an upper surface of the pixel electrode such that the material layer is formed on the pixel electrode and the bank portion adjacent to the pixel electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
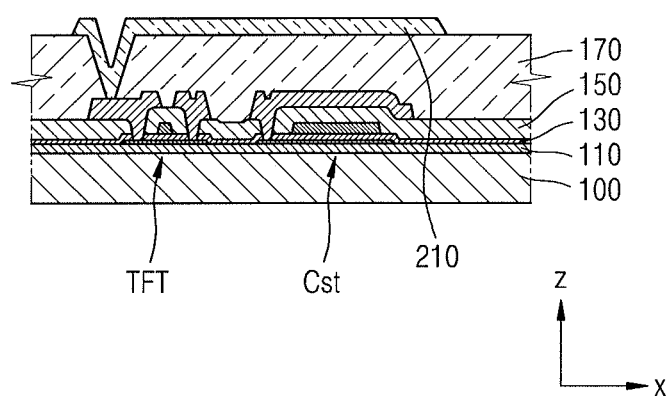
FIGS. 1 to 8 illustrate cross-sectional views depicting stages of a method of manufacturing a display device, according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 7:
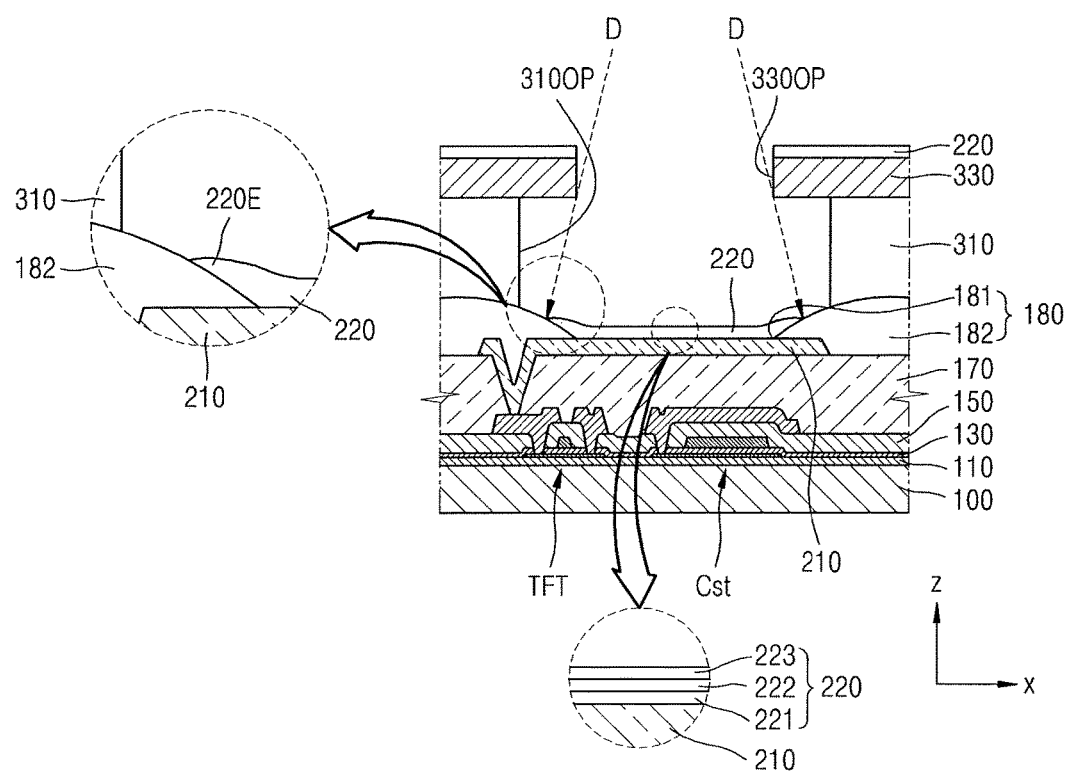
Figure 8:
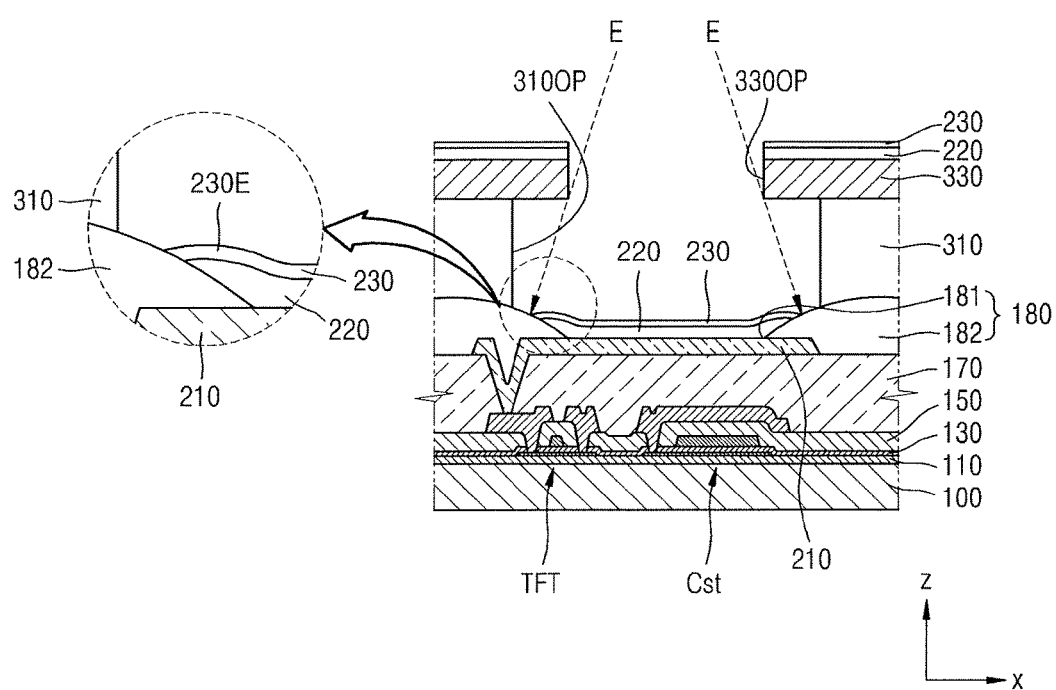
Figure 9A:
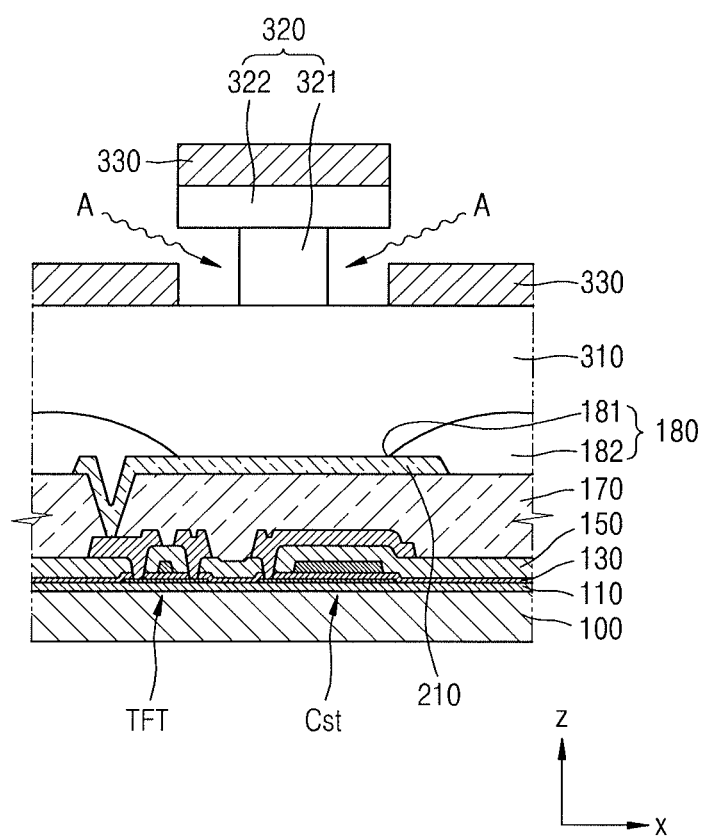
FIGS. 9A to 9C illustrate cross-sectional views depicting stages of a method of forming a second open region in a method of forming a display device according to an embodiment.
Figure 9B:
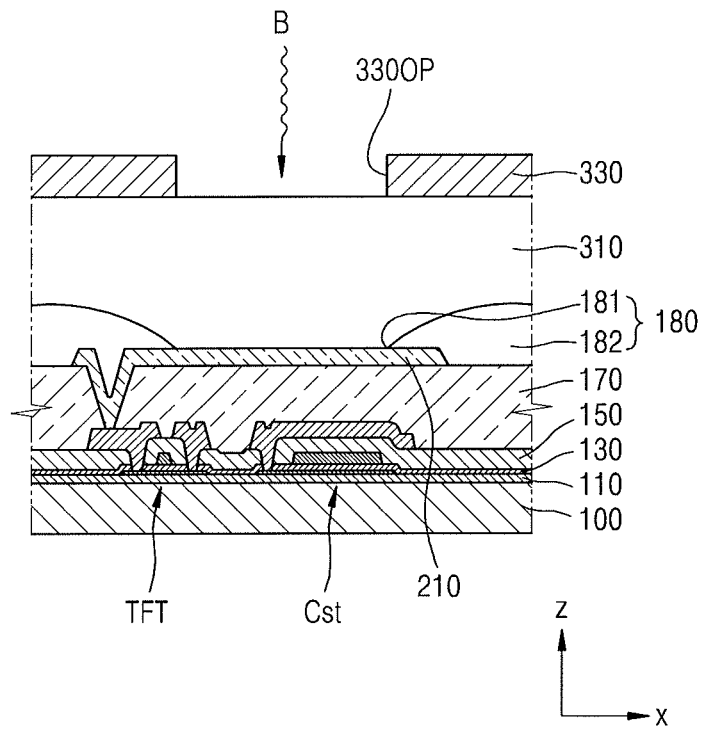
Figure 9C:
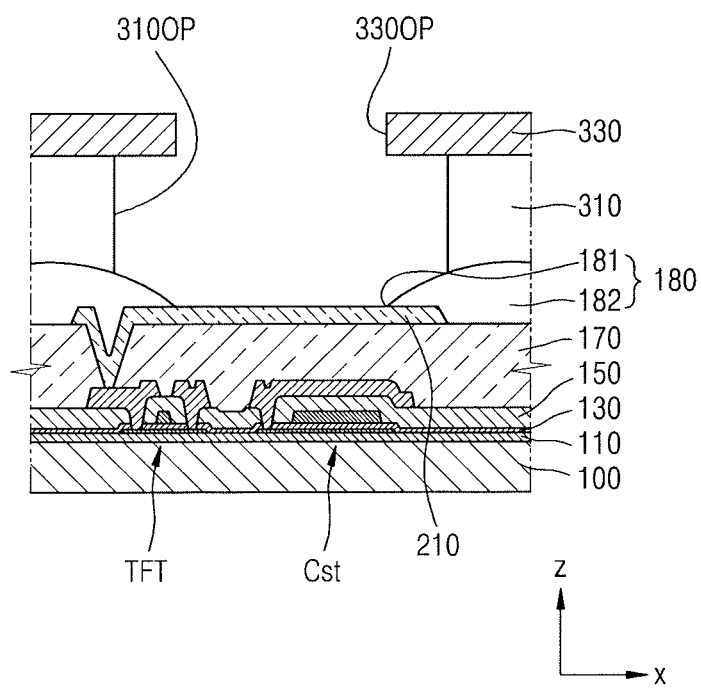
Figure 10A:
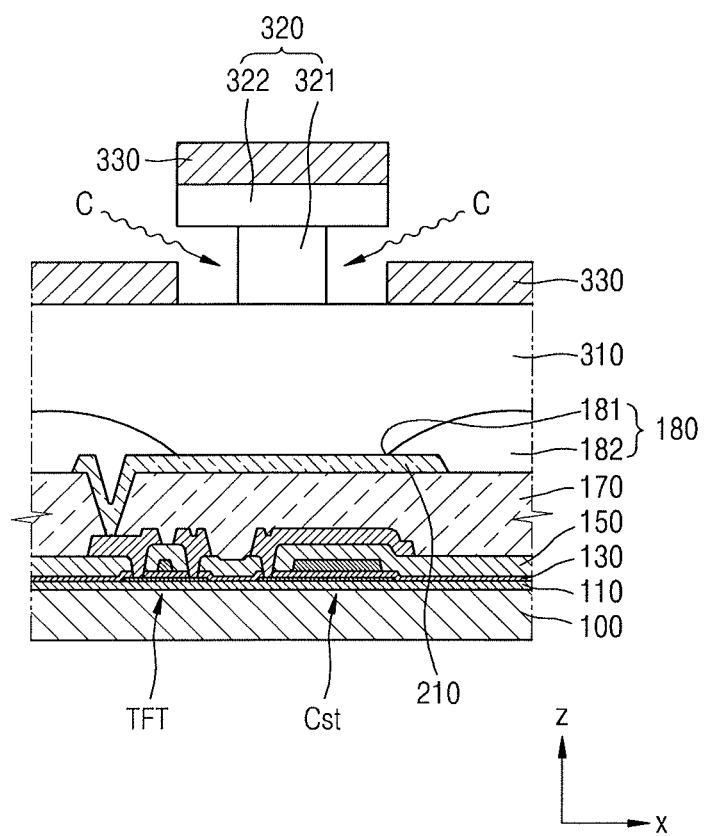
FIGS. 10A and 10B illustrate cross-sectional views depicting stages of a method of forming a second open region in a method of forming a display device according to another embodiment.
Figure 10B:
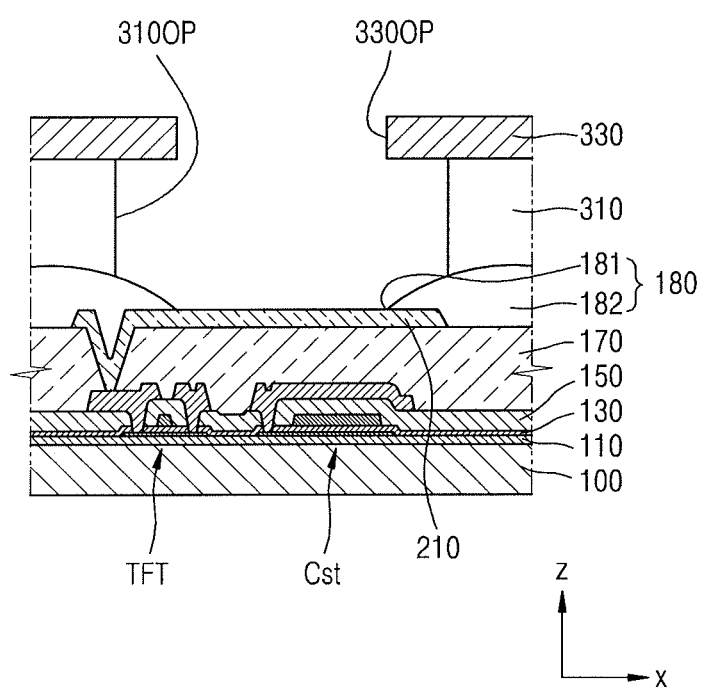

FIGS. 1 to 8 are cross-sectional views illustrating stages of a method of manufacturing a display device, according to embodiments, FIGS. 9A and 9C are cross-sectional views illustrating stages of a method of forming a second open region in a method of forming a display device according to an embodiment, and FIGS. 10A to 10B are cross-sectional views illustrating stages of a method of forming a second open region in a method of forming a display device according to another embodiment.

Referring to FIG. 1, a pixel electrode 210 may be formed.

Various layers may be formed first before the pixel electrode 210 is formed over a substrate 100. FIG. 1 illustrates that after a thin film transistor (TFT) and a storage capacitor Cst are formed and a planarization insulating layer 170 covering these elements is formed over the substrate 100, the pixel electrode 210 may be formed on the planarization insulating layer 170.

The substrate 100 may include various materials such as a glass material, a metal material, or a plastic material such as polyethylene terephthalate (PET), polyethylene naphthalate (PEN), and polyimide (PI). A buffer layer 110 that blocks impurities from penetrating into a semiconductor layer of a TFT, a gate insulating layer 130 that insulates the semiconductor layer of the TFT from a gate electrode, an interlayer insulating layer 150 that insulates a source electrode and a drain electrode of the TFT from the gate electrode of the TFT, and the planarization insulating layer 170 covering the TFT and including an approximately flat upper surface may be formed over the substrate 100.

The buffer layer 110 may include an oxide layer, such as a layer including SiOx, and/or a nitride layer, such as a layer including SiNx. The gate insulating layer 130 and the interlayer insulating layer 150 may include SiOx, SiNx, SiON, $Al_2O_3$, $TiO_2$, $Ta_2O_5$, $HfO_2$, $ZnO_5$, etc. The planarization insulating layer 170 may include an organic material such as acrylic, benzocyclobutene (BCB), PI, hexamethyldisiloxane (HMDSO), etc. The buffer layer 110, the gate insulating layer 130, the interlayer insulating layer 150, and the planarization insulating layer 170 may include a single layer or a multi-layer.

Although FIG. 1 illustrates insulating layers ranging from the buffer layer 110 to the planarization insulating layer 170, in some implementations, an insulating layer may be further disposed depending on a structure of the TFT and the storage capacitor Cst.

The pixel electrode 210 may include, for example, a conductive oxide such as indium tin oxide (ITO), indium zinc oxide (IZO), zinc oxide (ZnO), indium oxide ($In_2O_3$), indium gallium oxide (IGO), and aluminum zinc oxide (AZO). In some implementations, the pixel electrode 210 may include a reflective layer including Ag, Mg, Al, Pt, Pd, Au, Ni, Nd, Ir, Cr, or a compound thereof and/or a layer including ITO, IZO, ZnO, or $In_2O_3$ on the reflective layer. The pixel electrode 210 may include a single layer or a multi-layer.

The pixel electrode 210 may be formed by, for example, forming a layer including a material forming the pixel electrode 210 on the planarization insulating layer 170, and then performing wet etching on the layer.

Figure 2:
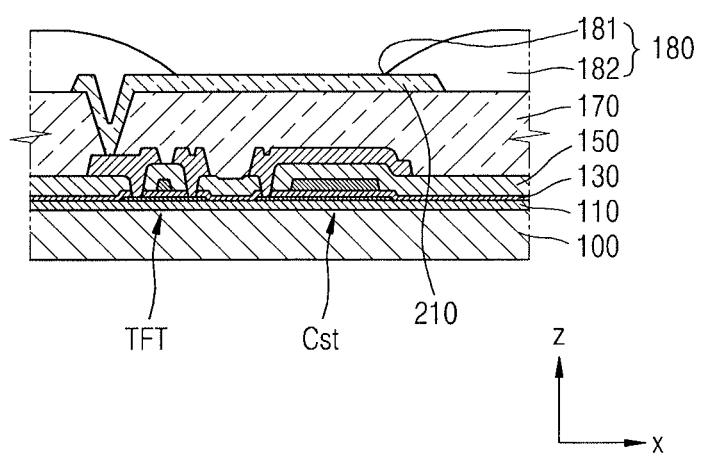

Referring to FIG. 2, an insulating layer 180 (referred to hereinafter as the pixel-defining layer 180) including an opening 181 that overlaps the pixel electrode 210, and a bank portion 182 that defines the opening 181 may be formed. The bank portion 182 may surround the opening 181.

The pixel electrode 210 may be exposed through the opening 181 of the pixel-defining layer 180. The bank portion 182 of the pixel-defining layer 180 may prevent an arc, etc. from occurring at an edge of the pixel electrode 210 by increasing a distance between the edge of the pixel electrode 210 and a second electrode 230 that will be described below.

The pixel-defining layer 180 may include an organic material and/or an inorganic material, and may be in a form of a single layer or a multi-layer. The organic material may include an olefin-based organic material, an acrylic-based organic material, or an imide-based organic material. The imide-based organic material may be, for example, PI. An inorganic material may include a silicon oxide or a silicon nitride.

When the pixel-defining layer 180 includes an organic material, a bake process may be performed after the pixel-defining layer 180 is formed. For example, a gas remaining in the organic material of the pixel-defining layer 180 may be removed by performing the bake process for about one hour at a temperature of about 250° C. after the pixel-defining layer 180 is formed.

Figure 3:
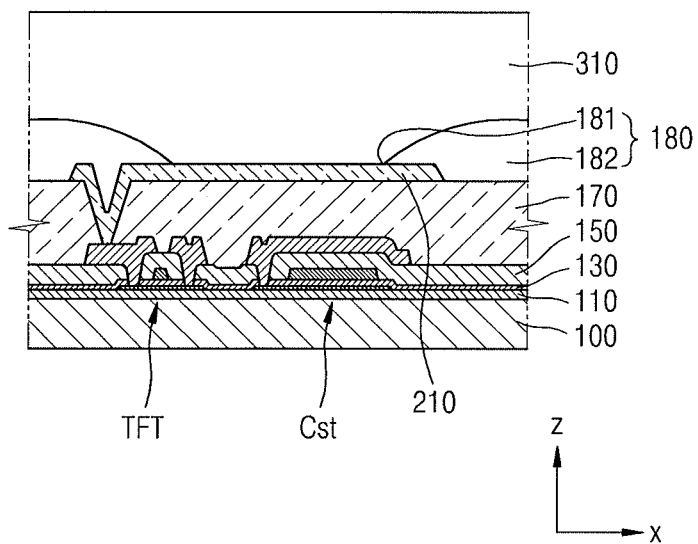

Referring to FIG. 3, a first non-photosensitive layer 310 is formed over the substrate 100 over which the pixel-defining layer 180 has been formed.

The first non-photosensitive layer 310 may be formed to entirely cover the substrate 100 over which the pixel-defining layer 180 has been formed. The first non-photosensitive layer 310 may have a single body to cover all of the opening 181 and the bank portion 182 of the pixel-defining layer 180. The first non-photosensitive layer 310 may be formed by a suitable method such as a coating method, a printing method, and/or deposition method.

The first non-photosensitive layer 310 may include a first non-photosensitive material. The first non-photosensitive material may be a fluorine-based non-photosensitive material. The first non-photosensitive layer 310 may include, for example, a fluoropolymer. The fluoropolymer may include a polymer including fluorine in an amount of about 20 wt % to about 60 wt %. For example, a fluoropolymer may include at least one of polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkylvinylether, or a copolymer of chlorotrifluoroethylene and perfluoroalkylvinylether, etc.

Figure 4:
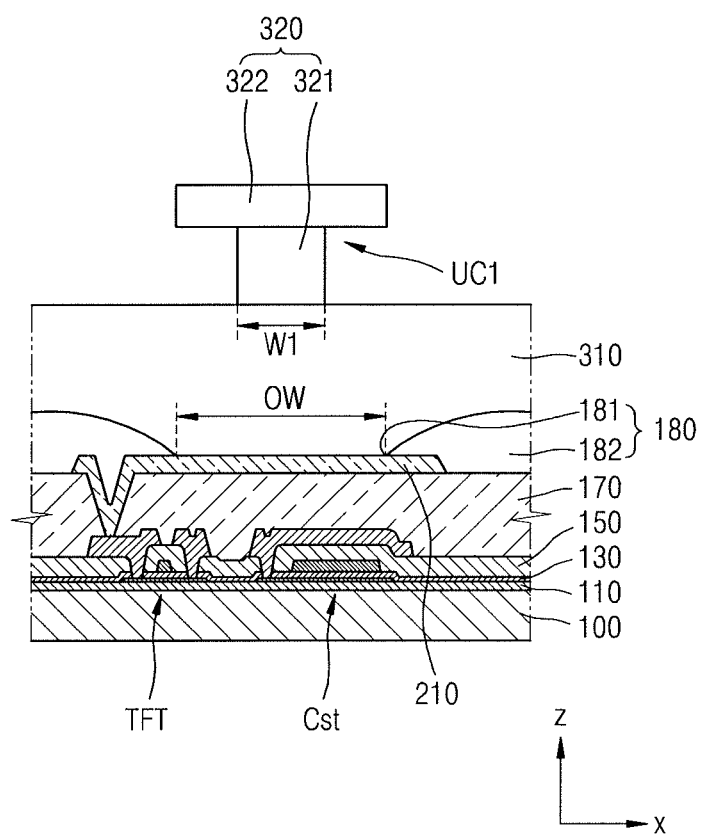

Referring to FIG. 4, a temporary layer 320 including a second non-photosensitive material may be formed over a portion of the first non-photosensitive layer 310.

The temporary layer 320 may be formed in a region of the first non-photosensitive layer 310 overlapping the opening 181 of the pixel-defining layer 180. The temporary layer 320 may have an undercut structure UC-1. A lower portion 321 of the temporary layer 320 may have a width less than that of an upper portion 322 of the temporary layer 320 to provide the undercut structure UC-1. The width W1 of the lower portion 321 of the temporary layer 320 may have a value equal to or less than a width OW of the opening 181 of the pixel-defining layer 180. If the width W1 of the lower portion 321 were to be greater than the width OW of the opening 181, a width of a material layer that will be formed during a process described below, for example, a width of an intermediate layer and the second electrode, could be excessively large and thus material could be wasted unnecessarily and high resolution could be difficult to implement.

The lower portion 321 of the temporary layer 320 may include the second non-photosensitive material that is different from the first non-photosensitive material of the first non-photosensitive layer 310. For example, the second non-photosensitive material may include a non-fluorine-based and non-photosensitive material.

The upper portion 322 of the temporary layer 320 may include a material different from the material of the lower portion 321 of the temporary layer 320. For example, the upper portion 322 of the temporary layer 320 may include a photosensitive material.

In an embodiment, the temporary layer 320 having the undercut structure UC-1 may be formed by a process described below. First, a second non-photosensitive material layer may be formed on the first non-photosensitive layer 310 and a photoresist layer may be formed on the second non-photosensitive material layer sequentially. Next, the upper portion 322 may be formed by patterning the photoresist layer, and then a portion of the second non-photosensitive material layer that is not covered by the upper portion 322 may be removed. The undercut structure UC-1 may be formed by further removing (e.g. over-etching) a region of the second non-photosensitive material layer overlapping an end (edge) of the upper portion 322 when removing the portion of the second non-photosensitive material layer.

Figure 5:
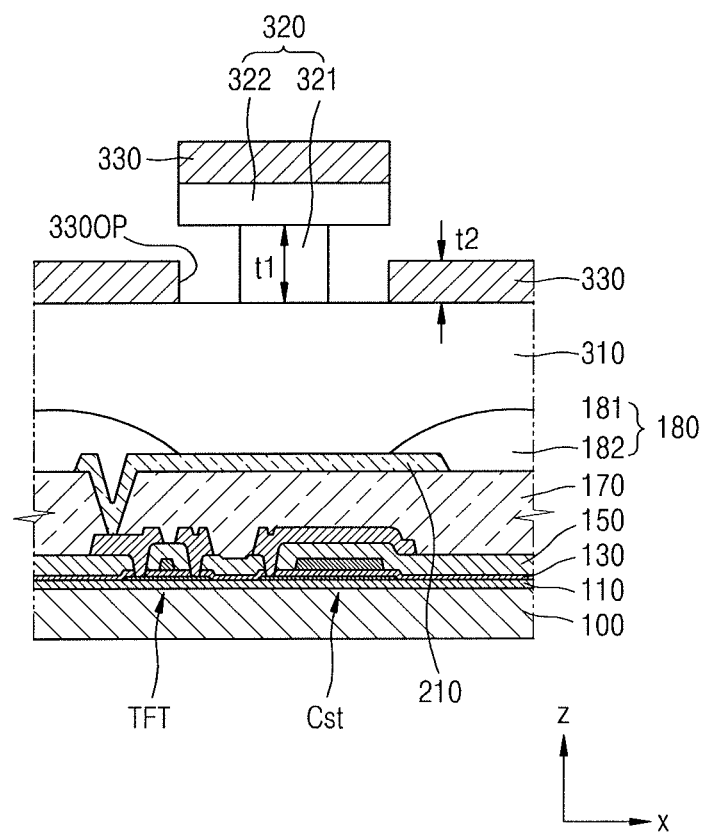

Referring to FIG. 5, a shadow layer 330 may be formed over the substrate 100 over which the temporary layer 320 including the second non-photosensitive material has been formed.

The shadow layer 330 may include a non-photosensitive material, and may include a material that does not react to a solvent that etches the temporary layer 320, the first non-photosensitive layer 310, and the second non-photosensitive material. For example, the shadow layer 330 may be an inorganic material layer. The inorganic material layer may include a single layer or a multiple layers including at least one of metal and an inorganic insulating material. The metal may be formed by atomic layer deposition (ALD) or vapor deposition (e.g. chemical vapor deposition (CVD), physical vapor deposition), etc. Examples of CVD include APCVD (atmospheric pressure CVD), LPCVD (low pressure CVD), PECVD (plasma enhanced CVD), HDPCVD (high density plasma CVD), and ALCVD (atomic layer CVD), etc. Examples of physical vapor deposition include sputtering, thermal evaporation, and E-beam evaporation. The inorganic insulating material may be formed by vapor deposition, for example, PECVD.

The shadow layer 330 on the first non-photosensitive layer 310 may include a first open region 330OP. The first open region 330OP may overlap the temporary layer 320 and may be formed while a material forming the shadow layer 330 is deposited on the upper portion 322 of the temporary layer 320. When the first open region 330OP is formed while a portion of the shadow layer 330 on the upper portion of the temporary layer 320 is separated from a portion of the shadow layer 330 on the first non-photosensitive layer 310, a thickness t1 of the lower portion 321 of the temporary layer 320 may be greater than a thickness t2 of the shadow layer 330.

As a comparative example, in a process of forming the first open region 330OP, instead of using the temporary layer 320 having the undercut structure UC-1, a method of forming the first open region 330OP by forming the shadow region 330 such that the shadow region 330 entirely covers the first non-photosensitive layer 310, and then etching the shadow region 330 using a photoresist may be considered. However, in the case of forming the shadow layer 330 including an inorganic base material such that the shadow region 330 entirely covers the first non-photosensitive layer 310, a property of a surface (an upper surface) of the first non-photosensitive layer 310 may change during a process of forming the shadow layer 330. Such a phenomenon may more distinctly appear due to plasma, etc. in a process of forming the shadow layer 330 including an inorganic insulating material rather than a process of forming the shadow layer 330 including metal. For example, a bridging reaction of a material included in the first non-photosensitive layer 310 may be caused by plasma used while the shadow layer 330 including the inorganic insulating material is formed. A property of a surface of the first non-photosensitive layer 310 may change, such that it may be difficult to etch the first non-photosensitive layer 310 with a solvent used in a process described below with reference to FIG. 6 However, according to an embodiment, the shadow layer 330 including the first open region 330OP is formed by using the temporary layer 320 including the second non-photosensitive material. Accordingly, a phenomenon that a property of the surface (the upper surface) of the first non-photosensitive layer 310 entirely changes such that the first non-photosensitive layer 310 is difficult to etch may be prevented. For example, according to an embodiment, when the shadow layer 330 is formed on only a portion of the surface (the upper surface) of the first non-photosensitive layer 310 due to the presence of the temporary layer 320 including the second non-photosensitive material, the solvent etching the first non-photosensitive layer 310 may penetrate to the first non-photosensitive layer 310 through a portion of the first non-photosensitive layer 310 that does not contact the shadow layer 330, and thus the above-described etching difficulty may be avoided.

Figure 6:
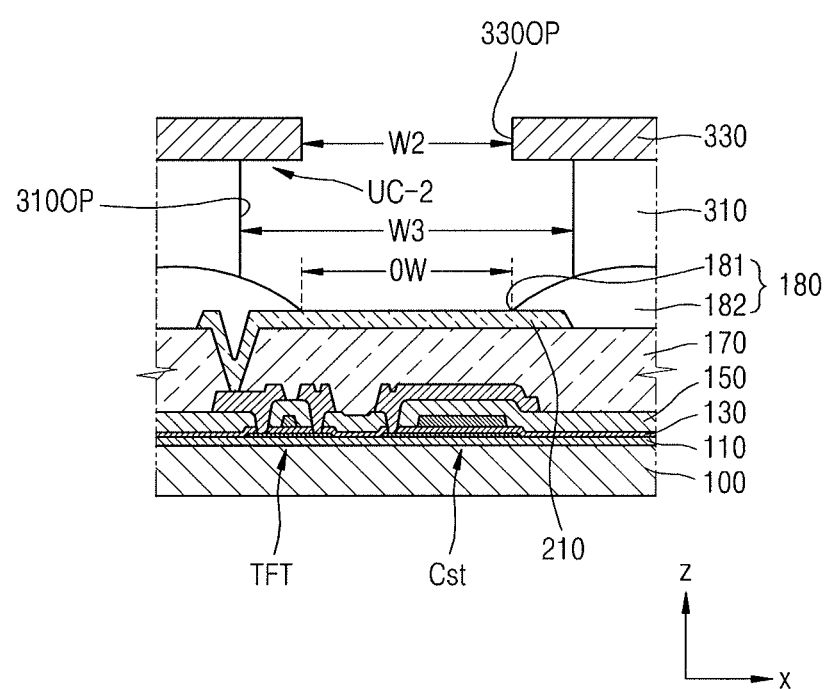

Referring to FIG. 6, a second open region 310OP is formed by removing a portion of the first non-photosensitive layer 310. The second open region 310OP may overlap the first open region 330OP of the shadow region 330.

A portion of the first non-photosensitive layer 310 may be removed by using solvent that etches a material of the first non-photosensitive layer 310, for example, solvent that etches a fluoropolymer. For example, the solvent that etches a fluoropolymer may be or include hydrofluoroether (HFE).

The temporary layer 320 having the undercut structure UC-1 may be removed independently of the etching process of removing a portion of the first non-photosensitive layer 310 (see FIGS. 9A to 9C), or may be simultaneously removed when a portion of the first non-photosensitive layer 310 is removed (see FIGS. 10A and 10B).

In an embodiment, as illustrated in FIGS. 9A and 9B, before a portion of the first non-photosensitive layer 310 is removed, the temporary layer 320 may be removed first. The temporary layer 320 may be removed by using solvent. For example, the temporary layer 320 may be lifted off by using solvent, for example, tetra-methyl ammonium hydroxide (TMAH), which may etch the second non-photosensitive material forming the lower portion 321 of the temporary layer 320.

The solvent that etches the second non-photosensitive material may penetrate to the lower portion 321 of the temporary layer 320 through a path "A" of FIG. 9A to etch the lower portion 321 of the temporary layer 320. When the lower potion 321 is etched, the temporary layer 320 on the first non-photosensitive layer 310 may also be removed, as illustrated in FIG. 9B.

Subsequently, the second open region 310OP may be formed in the first non-photosensitive layer 310 by using a solvent (e.g. HFE) that etches the first non-photosensitive layer 310 through the first open region 330OP of the shadow layer 330. The solvent (e.g. HFE), which etches the first non-photosensitive layer 310, may penetrate to the first non-photosensitive layer 310 through a path "B" shown in FIG. 9B, passing through the first open region 330OP, and may etch (e.g. over-etching) a region of the first non-photosensitive layer 310 overlapping the first open region 330OP and surroundings thereof to form the second open region 310OP as illustrated in FIG. 9C.

The inorganic base material included in the shadow layer 330 does not react to the solvent (e.g. HFE) that etches the first non-photosensitive layer 310. Accordingly, the second open region 310OP of the first non-photosensitive layer 310 may be formed without damaging the shadow layer 330.

In another embodiment, as illustrated in FIGS. 10A and 10B, the solvent (e.g. HFE) may etch a portion of the first non-photosensitive layer 310 disposed under the temporary layer 320 through a path "C". As described with reference to FIG. 5 above, the thickness t1 (see FIG. 5) of the lower portion 321 of the temporary layer 320 may be greater than the thickness t2 of the shadow layer 330 and so a portion of the shadow layer 330 on the temporary layer 320 may be isolated (or disconnected) from the rest of the shadow layer 330. Accordingly, the path "C" may be formed.

The second open region 310OP may be formed when a portion of the first non-photosensitive layer 310 is removed by the solvent. Accordingly, the temporary layer 320 on the portion of the first non-photosensitive layer 310 that is to be removed may be lifted off from the first non-photosensitive layer 310.

Referring to FIG. 6 again, an end (edge) of the shadow layer 330 adjacent to the first open region 330OP may extend toward a center of the first open region 330OP farther than an end (edge) of the first non-photosensitive layer 310 adjacent to the second open region 310OP. An undercut structure UC-2 may be formed. For example, a width W2 of the first open region 330OP may be less than a width W3 of the second open region 310OP. The width W3 of the second open region 310OP may be greater than a width OW of the opening 181 of the pixel-defining layer 180 (or greater than a width of the pixel electrode 210 exposed through the opening 181).

Referring to FIG. 7, a material layer may be formed over the substrate 100 including a stack of the shadow layer 330 and the first non-photosensitive layer 310 respectively including the first and second open regions 330OP and 310OP. The material layer may be, for example, an intermediate layer 220 including an emission layer. As illustrated in an enlarged view of FIG. 7, the intermediate layer 220 may include the emission layer 222, a first functional layer 221 between the pixel electrode 210 and the emission layer 222, and a second functional layer 223, which is a layer opposite to the first functional layer 221, with the emission layer 222 therebetween.

The intermediate layer 220 may include a low molecular or polymer material. When the intermediate layer 220 includes a low molecular material, the intermediate layer 220 may have a structure in which a hole injection layer (HIL), a hole transport layer (HTL), an emission layer (EML) 222, an electron transport layer (ETL), an electron injection layer (EIL), etc. are stacked in a single or a composite configuration. The intermediate layer 220 may include various organic materials such as copper phthalocyanine (CuPc), N,N-di(naphthalene-1-yl)-N,N-diphenylbenzidine (NPB), or tris-8-hydroxyquinoline aluminum (Alq3). The HIL and HTL may correspond to the first functional layer 221 of FIG. 7, and the ETL and EIL may correspond to the second functional layer 223.

When the intermediate layer 220 includes a polymer material, the intermediate layer 220 may generally have a structure including the first functional layer 221 including the HTL and the EML 222. In this case, the HTL may include PEDOT, and the EML 222 may include a polymer material such as polyphenylene vinylene (PPV)-based material or a polyfluorene-based material.

The intermediate layer 220 may be formed by vacuum deposition. In an embodiment, the intermediate layer 220 may be formed by thermal evaporation under a vacuum state.

The intermediate layer 220 may be formed under vacuum atmosphere (e.g. several to tens of x $10^{-5}$ torr) by using a stack of the first non-photosensitive layer 310 and the shadow layer 330 as a template. Under a vacuum atmosphere, a gas coming from the first non-photosensitive layer 310 is in an inert state, for example, has low reactivity, and thus does not influence quality of the intermediate layer 220 or little influences the quality of the intermediate layer 220. The shadow layer 330 may include an inorganic base material. Accordingly, the shadow layer 330 may not influence the quality of the intermediate layer 220. Therefore, outgassing, in which a gas coming from an organic material such as a photoresist remarkably reduces the quality of the intermediate layer 220, which could occur if organic material such as the photoresist were to be used instead of the shadow layer 330 in a comparative example, may be prevented. The pixel-defining layer 180 may include an organic material. accordingly a gas from the pixel-defining layer 180 may be discharged by the bake process as described above, and outgassing in the vacuum process of forming the intermediate layer 220 may be avoided.

In forming the intermediate layer 220, a material forming the intermediate layer 220 may be incident obliquely with respect to a direction perpendicular to an upper surface of the pixel electrode 210. For example, the material forming the intermediate layer 220 may be incident along a path "D" of FIG. 7 and be formed, for example, deposited on at least the pixel electrode 210. For example, as illustrated in another enlarged view of FIG. 7, the material forming the intermediate layer 220 may be deposited on the pixel electrode 210 and an upper surface of the bank portion 182 adjacent to the pixel electrode 210. A width of the intermediate layer 220 may be greater than a width of the pixel electrode 210 exposed through the opening 181, and an end 220E of the intermediate layer 220 may extend onto and contact the bank portion 182.

The material layer formed by using the stack of the shadow layer 330 and the first non-photosensitive layer 310 may include not only the intermediate layer 220 described with reference to FIG. 7 but also a conductive layer 230 that will be described below.

As illustrated in FIG. 8, the conductive layer 230 may be formed by using a stack of the shadow layer 330 and the first non-photosensitive layer 310. The conductive layer 230 may be formed by a vacuum deposition method. The conductive layer 230 may be formed by a physical vapor deposition method such as thermal evaporation or sputtering, etc. under a vacuum state. For example, like the intermediate layer 220, when the conductive layer 230 is formed by using the stack of the shadow layer 330 and the first non-photosensitive layer 310 and using the same method (e.g. thermal evaporation) as that of the intermediate layer 220, a process of manufacturing a display device may be simplified, and the intermediate layer 220 and the conductive layer 230 may be formed in the same chamber. Therefore, an inflow of impurities or forming of an unnecessary layer due to non-continuity of processes of forming the intermediate layer 220 and the conductive layer 230 and/or non-continuity of chambers in which the intermediate layer 220 and the conductive layer 230 are formed, may be avoided.

The conductive layer 230 may be an electrode (a conductive layer) facing the pixel electrode 210. In this case, the conductive layer 230 may be a reflective electrode or a light-transmissive electrode. In some implementations, the conductive layer 230 may be a conductive protective layer configured to protect the intermediate layer 220.

The conductive layer 230 may include a conductive metal layer including Ag, Mg, Al, Yb, Ca, Li, Au, or a compound thereof, and/or include a conductive oxide layer such as a transparent conductive oxide (TCO) layer. The TCO layer may include ITO, IZO, ZnO, $In_2O_3$, IGO, or AZO. In an embodiment, the conductive layer 230 may include an alloy including Ag and Mg (e.g. the Ag content may be greater than the Mg content), and include a multi-layer including ITO, or include a single layer including the above-described materials.

In forming the conductive layer 230, a material forming the conductive layer 230 may be incident obliquely with respect to a direction (z direction) perpendicular to the substrate 100, for example, incident along a path "E" of FIG. 8, and may be deposited on the intermediate layer 220. For example, as illustrated in another enlarged view of FIG. 8, the material forming the conductive layer 230 may be deposited on the intermediate layer 220 and an upper surface of the bank portion 182 adjacent to the intermediate layer 220. A width of the conductive layer 230 may be greater than a width of the intermediate layer 220, and an end 230E of the conductive layer 230 may extend onto the bank portion 182 and contact the bank portion 182.

Figure 11:
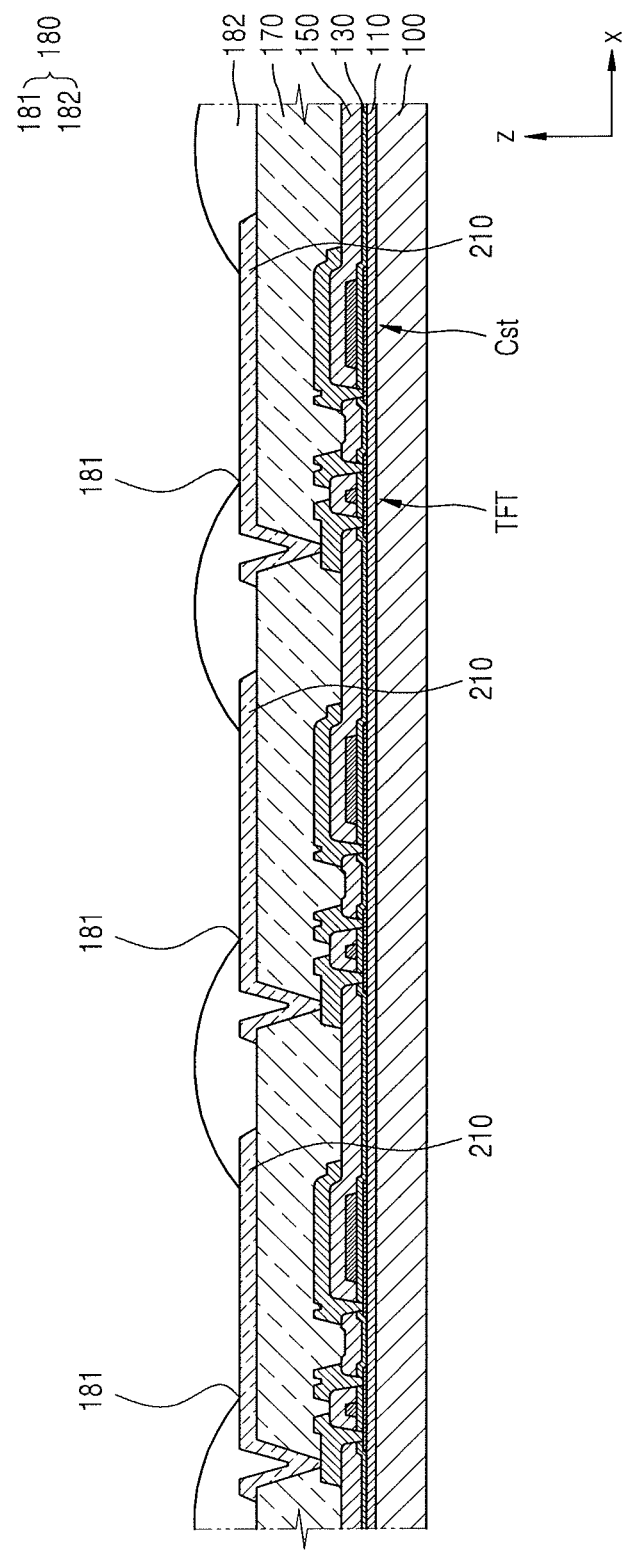
FIGS. 11 to 13 illustrate cross-sectional views depicting stages of a method of manufacturing a display device, according to another embodiment.
Figure 12:
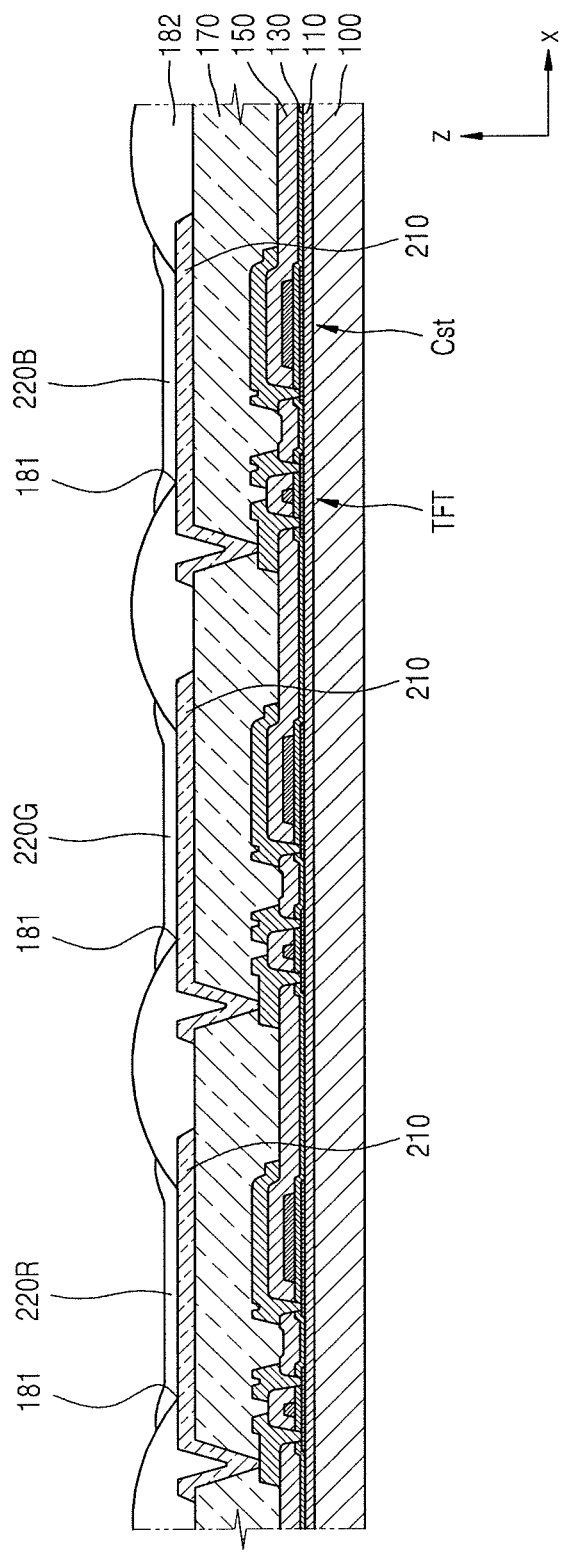
Figure 13:
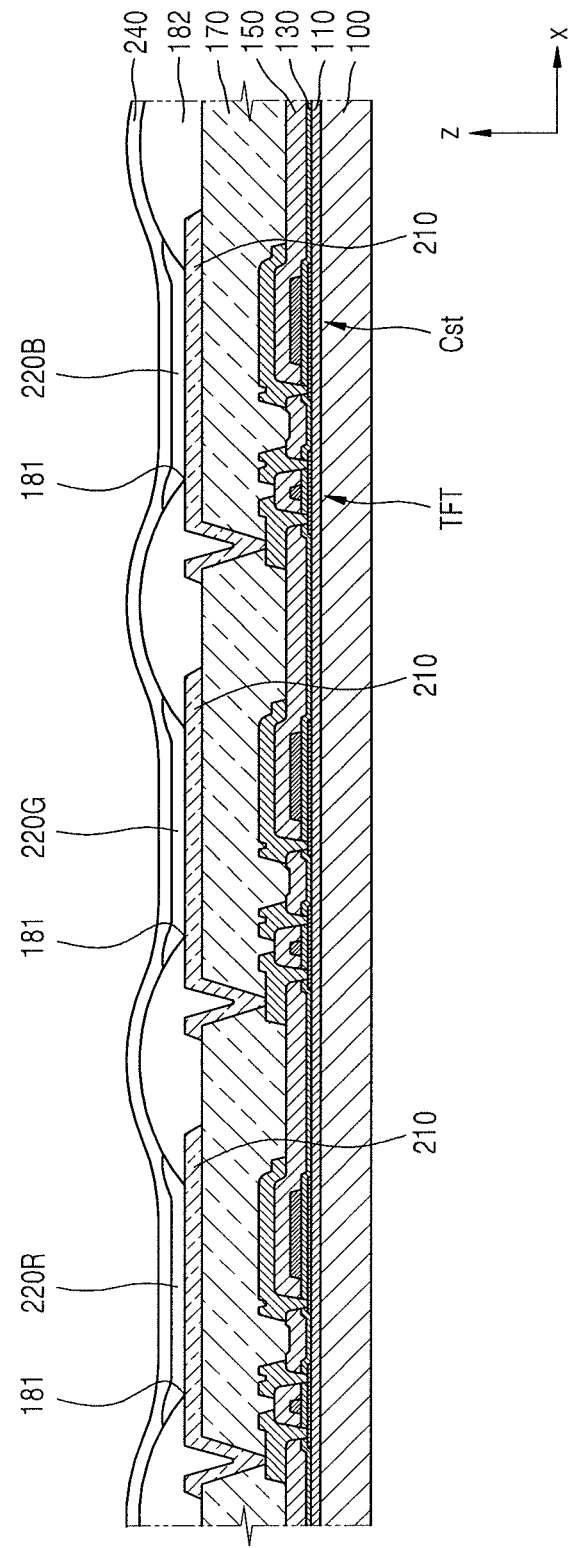

FIGS. 11 to 13 illustrate cross-sectional views of stages of a method of manufacturing a display device, according to another embodiment. FIGS. 11 to 13 are cross-sectional views of a method of forming each pixel, for example, a red pixel, a green pixel, and a blue pixel.

Referring to FIG. 11, the pixel electrodes 210 may be formed over the substrate 100. Before the pixel electrode 210 is formed, a TFT and a storage capacitor Cst may be formed. The buffer layer 110, the gate insulating layer 130, the interlayer insulating layer 150, the planarization insulating layer 170, etc. may be formed as described with reference to FIG. 1. The pixel electrodes 210 may include the same material and may be formed during the same process.

Also, the pixel-defining layer 180 including the openings 181 exposing the pixel electrodes 210, and the bank portions 182 between the pixel electrodes 210 and covering ends of the pixel electrodes 210, may be formed. A process of forming the pixel-defining layer 180 may be the same as that described with reference to FIG. 2.

Referring to FIG. 12, a red intermediate layer 220R emitting red light, a green intermediate layer 220G emitting green light, and a blue intermediate layer 220B emitting blue light may be formed over the substrate 100. The red, green, and blue intermediate layers 220R, 220G, and 220B may be respectively formed during individual processes. The red, green, and blue intermediate layers 220R, 220G, and 220B may be formed independently, and formed individually by using the first non-photosensitive layer 310 and the shadow layer 330 including the open regions, respectively, according to the process described with reference to FIGS. 3 to 7. For example, the red intermediate layer 220R may be formed according to the process described with reference to FIGS. 3 to 7. In this case, the first non-photosensitive layer 310 and the shadow layer 330 may cover regions other than the region in which the red intermediate layer 220R will be formed. After that, the green intermediate layer 220G may be formed over the substrate 100 on which the red intermediate layer 220R has been formed according to the above-described process. In this case, the first non-photosensitive layer 310 and the shadow layer 330 may cover the regions other than the region in which the green intermediate layer 220G will be formed. Next, the blue intermediate layer 220B may be formed over the substrate 100 over which the red and green intermediate layers 220R and 220G have been formed according to the above-described process. In this case, the first non-photosensitive layer 310 and the shadow layer 330 may cover regions other than the region in which the blue intermediate layer 220B will be formed. As a comparative example, in the case of using a photosensitive organic material such as a photoresist instead of the shadow layer 330 including the inorganic base material, it may be considered to perform a bake process in order to prevent outgassing. However, the already formed red intermediate layer 220R could be damaged by the temperature (e.g., about 140° C. or more) of the bake process of the photoresist for forming the green intermediate layer 220G over the substrate 100 over which the red intermediate layer 220R has been formed. In contrast, the present disclosure uses the above-described shadow layer 330 including the inorganic base material. Accordingly, outgassing does not occur, and there is no danger that a display device and a chamber could be contaminated by outgassing. Therefore, the bake process for preventing outgassing does not need to be performed.

After the red, green, and blue intermediate layers 220R, 220G, and 220B are formed on the pixel electrodes 210 in respective processes, the first non-photosensitive layer 310 and the shadow layer 330 may be removed. For example, when the first non-photosensitive layer 310 is lifted off by using a solvent that etches the first non-photosensitive layer 310, the shadow layer 330 and a material of the intermediate layer on the shadow layer 330 may be simultaneously removed.

Referring to FIG. 13, a common electrode 240 having one body to cover the red, green, and blue intermediate layers 220R, 220G, and 220B may be formed. The common electrode 240 may be formed using a process different from the process of forming the red, green, and blue intermediate layers 220R, 220G, and 220B described with reference to FIG. 12. For example, the common electrode 240 may be formed by using an open mask including one opening corresponding to the pixels.

Figure 14:
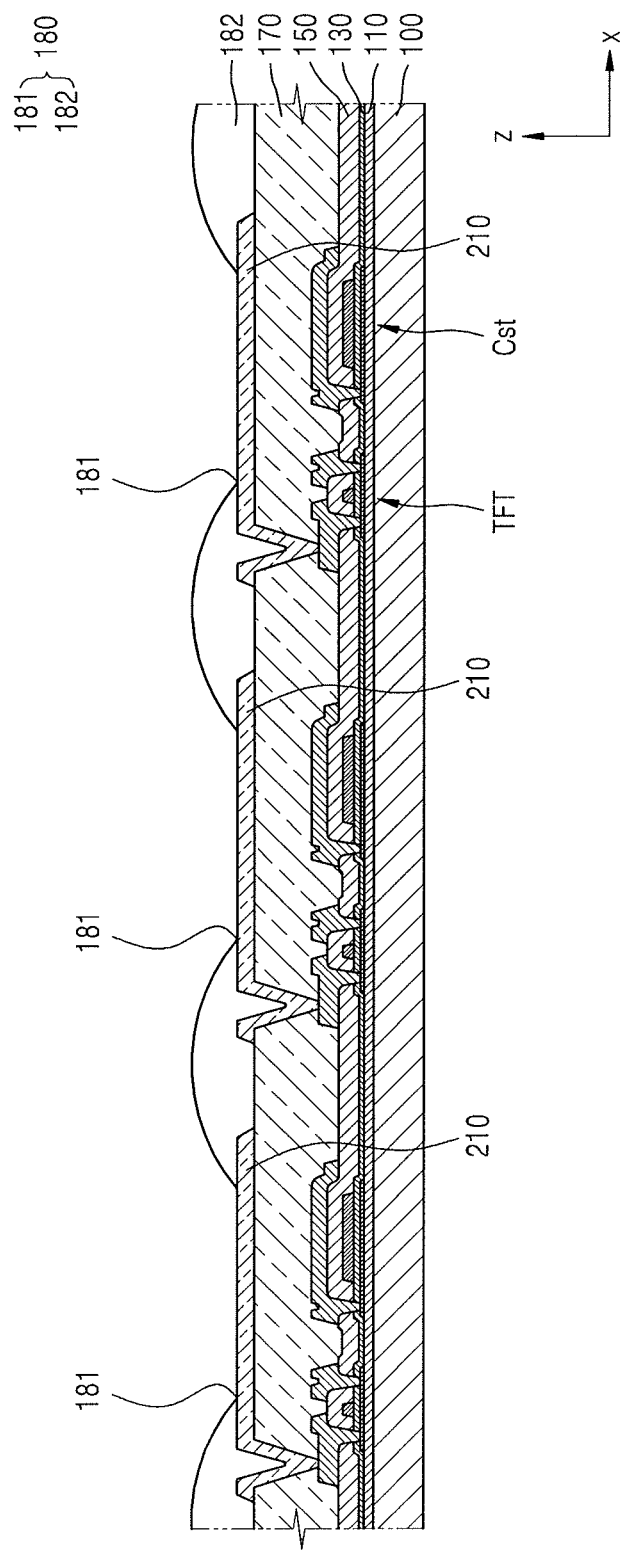
FIGS. 14 to 16 illustrate cross-sectional views depicting stages of a method of manufacturing a display device, according to another embodiment.
Figure 15:
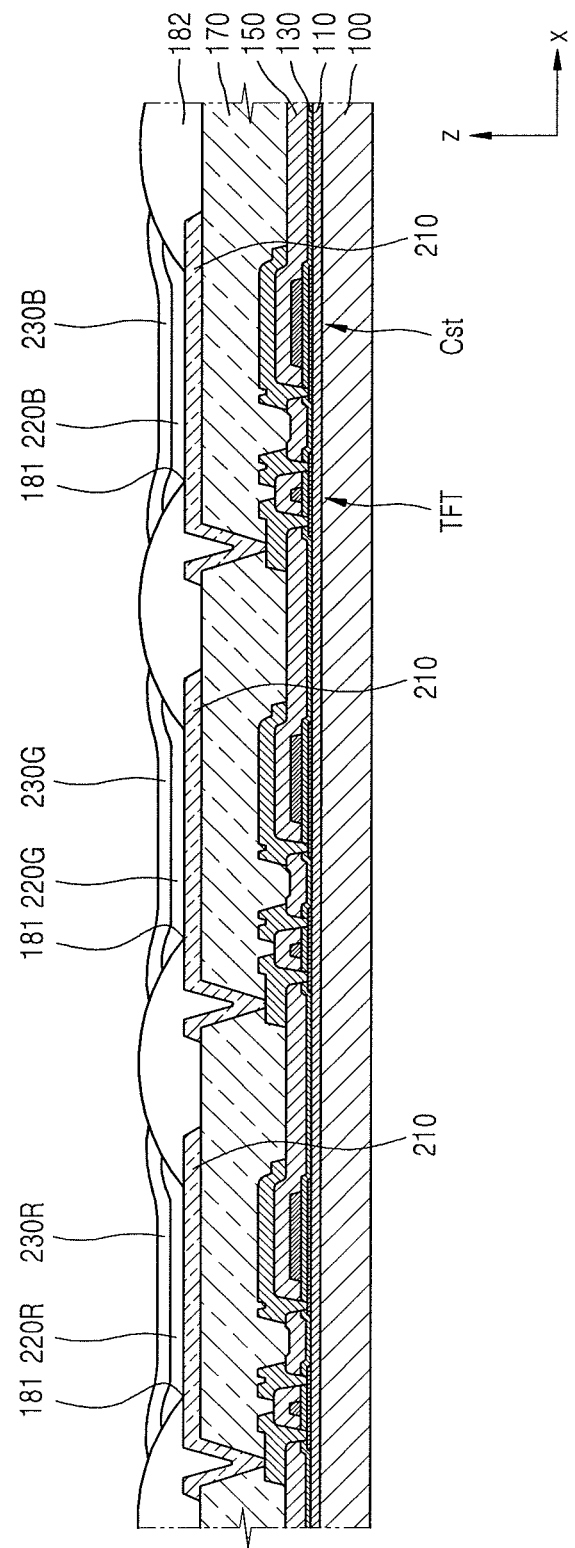
Figure 16:
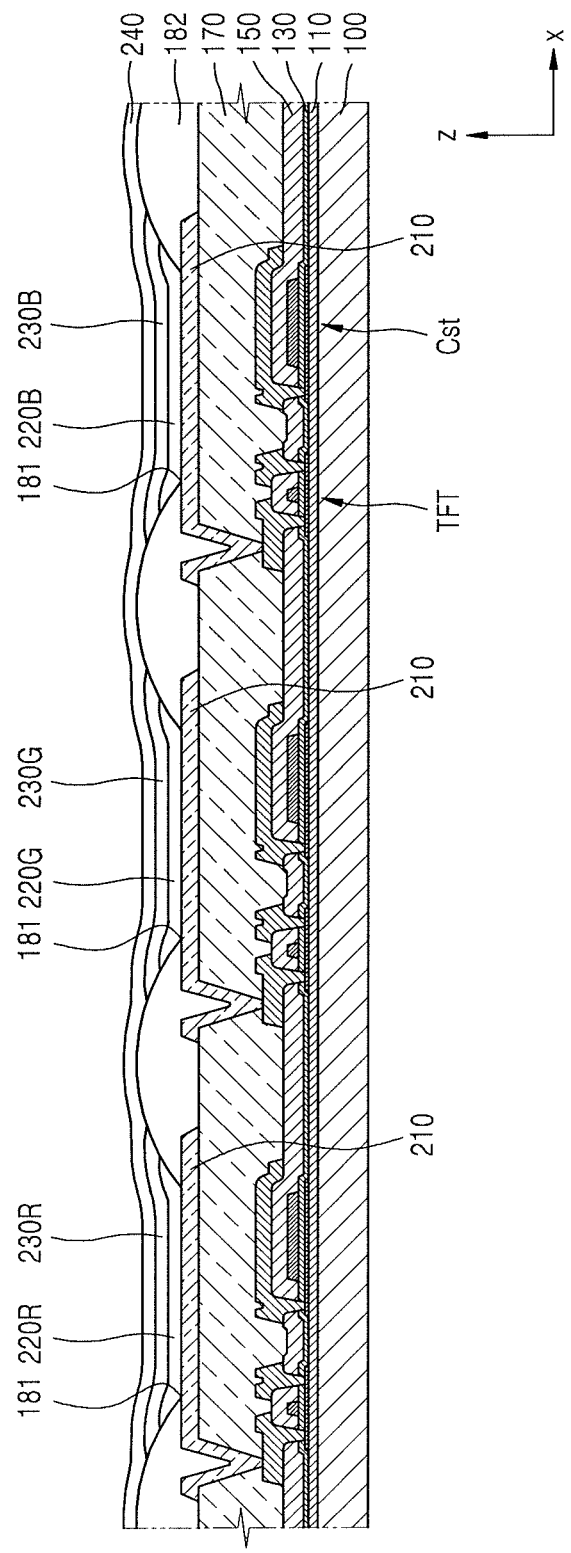

FIGS. 14 to 16 illustrate cross-sectional views of stages a method of manufacturing a display device, according to another embodiment. In more detail, FIGS. 14 to 16 illustrate cross-sectional views of stages of a method of forming each pixel, for example, a red pixel, a green pixel, and a blue pixel.

Referring to FIG. 14, the pixel electrodes 210 may be formed over the substrate 100, and the pixel-defining layer 180 including the opening 181 and the bank portion 182 may be formed. A specific process thereof may be the same as that described above.

Referring to FIG. 15, the intermediate layer 220R emitting red light and a conductive layer 230R on the intermediate layer 220R may be formed over the substrate 100. Similarly, the intermediate layer 220G emitting green light and a conductive layer 230G on the intermediate layer 220G may be formed, and the intermediate layer 220B emitting blue light and a conductive layer 230B on the intermediate layer 220B may be formed.

The intermediate layer 220R and the conductive layer 230R corresponding to a red pixel, the intermediate layer 220G and the conductive layer 230G corresponding to a green pixel, and the intermediate layer 220B and the conductive layer 230B corresponding to a blue pixel may be respectively formed during individual processes.

According to the process described with reference to FIGS. 3 to 8, the intermediate layer 220R and the conductive layer 230R corresponding to the red pixel may be formed by using the first non-photosensitive layer 310 and the shadow layer 330 respectively including the open regions. The shadow layer 330, and the intermediate layer 220R and the conductive layer 230R thereon may be removed, and the intermediate layer 220R and the conductive layer 230R may be formed on the pixel electrode 210 by lifting off the first non-photosensitive layer 310 using solvent etching of the first non-photosensitive layer 310. Subsequently, according to the process described with reference to FIGS. 3 to 8, the intermediate layer 220G and the conductive layer 230G corresponding to a green pixel may be formed. The intermediate layer 220G and the conductive layer 230G may be left on only the pixel electrode 210 by using the lift-off process. Similarly, according to the process described with reference to FIGS. 3 to 8, the intermediate layer 220B and the conductive layer 230B corresponding to a blue pixel may be formed on the pixel electrode 210. The conductive layers 230R, 230G, and 230B may respectively protect the intermediate layers 220R, 220G, and 220B from the solvent, etc. during the lift-off process.

Referring to FIG. 16, a common electrode 240 having one body to cover the red, green, and blue pixels may be formed. As described with reference to FIG. 13, the common electrode 240 may be formed by using an open mask including one opening corresponding to the pixels.

Although FIG. 16 illustrates a structure in which the common electrode 240 electrically contacts the conductive layers 230R, 230G, and 230B, in some implementations, the conductive layers 230R, 230G, and 230B may receive a voltage through a different wiring, for example, a wiring formed in the same layer as that of the pixel electrode 210. In this case, a process of forming the common electrode 240 may be omitted.

Although FIGS. 11 to 16 illustrate that the display device includes the red, green, and blue pixels, in some implementations, the display device may include red, green, blue, and white pixels.

By way of summation and review, in an organic light-emitting display device that implements a full range of colors, each pixel area may emit light of a different color. An emission layer of each pixel and an opposite electrode having one body over a plurality of pixels may be formed by using a deposition mask. As resolution of organic light-emitting display devices has gradually increased, a width of an open slit of a mask used during a deposition process has gradually narrowed, it becomes desirable to decrease dispersion. Also, to manufacture a high resolution organic light-emitting display device, it is desirable to reduce or remove a shadow effect. To this end, a method of performing a deposition process with a mask closely attached on a substrate may be used.

However, in the case of performing a deposition process with a mask attached on a substrate, the mask may damage a pixel-defining layer, etc. To prevent this, a spacer may be disposed on the pixel-defining layer, but doing so may involve additional processes and a thickness of an organic light-emitting display device may increase due to the spacer.

One or more embodiments include a method of manufacturing a display device, the method including forming a high quality intermediate layer and/or conductive layer, etc. on a pixel electrode.

Outgassing that may occur from an organic material, etc. during a process of forming an intermediate layer and/or a conductive layer, etc. may be prevented or minimized, and a high-quality display device may be manufactured. However, this effect is provided as an example, and effects according to embodiments are described in detail above.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of manufacturing a display device, the method comprising:
   forming a pixel electrode;
   forming a pixel-defining layer including an opening corresponding to the pixel electrode and a bank portion defining the opening;
   forming a first non-photosensitive layer on the pixel-defining layer;
   forming a temporary layer on a portion of the first non-photosensitive layer, the temporary layer including a second non-photosensitive material different from a material of the first non-photosensitive layer;
   forming an inorganic material layer on the first non-photosensitive layer by using the temporary layer to block a formation of the inorganic material layer on the portion of the first non-photosensitive layer on which the temporary layer is formed, such that the inorganic material layer includes a first open region corresponding to the opening in the pixel defining layer;
   forming a second open region in the first non-photosensitive layer, the second open region overlapping the first open region, and a width of the second open region being greater than a width of the first open region; and
   forming an intermediate layer on the pixel electrode by using the first non-photosensitive layer and the inorganic material layer as a template.

2. The method as claimed in claim 1, further comprising:
   forming a conductive layer on the intermediate layer.

3. The method as claimed in claim 2, wherein in forming the conductive layer, the first non-photoconductive layer and the inorganic material layer, respectively including the second open region and the first open region, is used as a template.

4. The method as claimed in claim 1, wherein the temporary layer including the second non-photosensitive material has an undercut structure in which a width of a lower portion thereof is less than a width of an upper portion thereof.

5. The method as claimed in claim 4, wherein:
   the lower portion of the temporary layer includes the second non-photosensitive material, and
   the upper portion of the temporary layer includes a material different from the material of the lower portion of the temporary layer.

6. The method as claimed in claim 5, wherein the upper portion of the temporary layer includes a photosensitive material.

7. The method as claimed in claim 1, wherein,
   in forming the inorganic material layer, an end of the inorganic material layer adjacent to the first open region is spaced apart from a lower portion of the temporary layer by a preset interval, and
   forming the second open region in the first non-photosensitive layer includes removing the temporary layer and a portion of the first non-photosensitive layer overlapping the temporary layer.

8. The method as claimed in claim 1, wherein a width of the second open region of the first non-photosensitive layer is greater than a width of the pixel electrode exposed through the opening of the pixel-defining layer.

9. The method as claimed in claim 1, wherein, in forming the intermediate layer, a material forming the intermediate layer is incident obliquely with respect to a direction perpendicular to an upper surface of the pixel electrode such that the intermediate layer is formed on the pixel electrode and the bank portion adjacent to the pixel electrode.

10. The method as claimed in claim 1, wherein the first non-photosensitive layer includes a fluorine-based non-photosensitive material.

11. A method of manufacturing a display device, the method comprising:
    forming a pixel electrode;
    forming an insulating layer including an opening corresponding to the pixel electrode and a bank portion defining the opening;
    forming a first non-photosensitive layer on the insulating layer;
    forming a temporary layer on a portion of the first non-photosensitive layer, the temporary layer including a material different from a material of the first non-photosensitive layer and having an undercut structure;
    forming a shadow layer on the first non-photosensitive layer by using the temporary layer as a template, the shadow layer including a first open region corresponding to the opening;
    forming a second open region in the first non-photosensitive layer, the second open region overlapping the first open region of the shadow layer and having a width greater than a width of the first open region;
    forming a material layer on the pixel electrode by using the first non-photosensitive layer and the shadow layer respectively as a template including the second open region and the first open region; and
    removing the first non-photosensitive layer and the shadow layer.

12. The method as claimed in claim 11, wherein the temporary layer includes a second non-photosensitive material.

13. The method as claimed in claim 11, wherein the shadow layer includes at least one of metal and an inorganic insulating material.

14. The method as claimed in claim 11, wherein, in forming the shadow layer, an end of the shadow layer adjacent to the first open region is spaced apart from a lower portion of the temporary layer by a preset interval.

15. The method as claimed in claim 14, wherein forming the second open region in the first non-photosensitive layer includes removing the temporary layer.

16. The method as claimed in claim 11, wherein the material layer is a conductive layer or an intermediate layer including an emission layer.

17. The method as claimed in claim 11, wherein the material layer is formed by thermal evaporation.

18. The method as claimed in claim 11, wherein the first non-photosensitive layer includes a fluorine-based non-photosensitive material.

19. The method as claimed in claim 11, wherein, in forming the second open region in the first non-photosensitive layer, an end of the shadow layer adjacent to the first open region extends farther toward a center of the first open region than an end of the first non-photosensitive layer adjacent to the second open region.

20. The method as claimed in claim 19, wherein, in forming the material layer, a material forming the material layer is incident obliquely with respect to a direction perpendicular to an upper surface of the pixel electrode such that the material layer is formed on the pixel electrode and the bank portion adjacent to the pixel electrode.

* * * * *